United States Patent
Umezawa

(10) Patent No.: US 12,293,920 B2
(45) Date of Patent: May 6, 2025

(54) STRUCTURE MANUFACTURING METHOD

(71) Applicant: FUJIFILM CORPORATION, Tokyo (JP)

(72) Inventor: Tomokazu Umezawa, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 497 days.

(21) Appl. No.: 17/929,311

(22) Filed: Sep. 2, 2022

(65) Prior Publication Data

US 2022/0415664 A1    Dec. 29, 2022

Related U.S. Application Data

(63) Continuation of application No. PCT/JP2021/005059, filed on Feb. 10, 2021.

(30) Foreign Application Priority Data

Mar. 25, 2020  (JP) ................................. 2020-055021

(51) Int. Cl.
H01L 21/308     (2006.01)
H01L 21/3065    (2006.01)

(52) U.S. Cl.
CPC ...... *H01L 21/3086* (2013.01); *H01L 21/3065* (2013.01)

(58) Field of Classification Search
CPC ............. H01L 21/3086; H01L 21/3065; B01L 2200/12; B01L 2300/0887; B01L 3/502707
See application file for complete search history.

(56) References Cited

U.S. PATENT DOCUMENTS

2018/0074230 A1 * 3/2018 Yoshizawa ............ C03C 17/245
2019/0067519 A1   2/2019 Niwa et al.

FOREIGN PATENT DOCUMENTS

JP    2009-128538 A        6/2009
JP    2013185188 A  *      9/2013
(Continued)

OTHER PUBLICATIONS

NPL (Year: 2015).*
(Continued)

*Primary Examiner* — Dale E Page
*Assistant Examiner* — Quovaunda Jefferson
(74) *Attorney, Agent, or Firm* — SOLARIS Intellectual Property Group, PLLC

(57) ABSTRACT

A structure is manufactured by forming a mask that has an opening pattern on a surface of a substrate, etching the surface of the substrate with the mask to form a recessed portion corresponding to the opening pattern of the mask, forming a thin film including aluminum on a bottom surface of the recessed portion in a state where the mask remains, treating the thin film including aluminum with hot water to change the thin film into a fine recessed and projected layer including alumina hydrate smaller than the recessed portion, etching the bottom surface of the recessed portion, on which the fine recessed and projected layer is formed, in a state where the mask remains to form a fine recessed and projected structure on the bottom surface of the recessed portion, and thereafter removing the mask and the fine recessed and projected structure, which remains after the etching step.

10 Claims, 10 Drawing Sheets

(56) References Cited

FOREIGN PATENT DOCUMENTS

| | | |
|---|---|---|
| JP | 5797133 B2 | 10/2015 |
| JP | 2017-107011 A | 6/2017 |
| JP | 2019-040039 A | 3/2019 |
| JP | 2019-040980 A | 3/2019 |
| JP | 2019-153704 A | 9/2019 |
| WO | 2016/170727 A1 | 10/2016 |
| WO | 2019/225518 A1 | 11/2019 |

OTHER PUBLICATIONS

International Search Report issued in International Application No. PCT/JP2021/005059 on May 11, 2021.
Written Opinion of the ISA issued in International Application No. PCT/JP2021/005059 on May 11, 2021.

* cited by examiner

FIG. 4
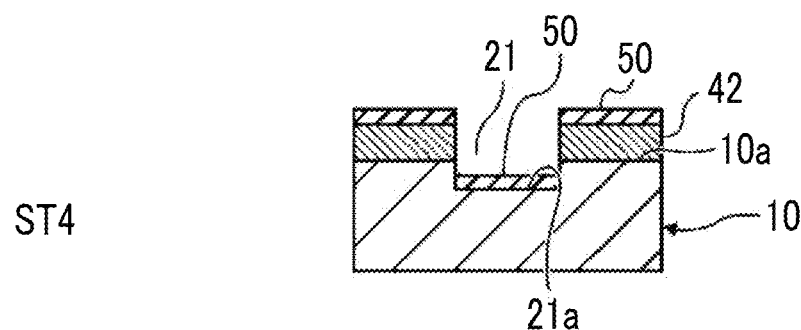
ST4
ST5
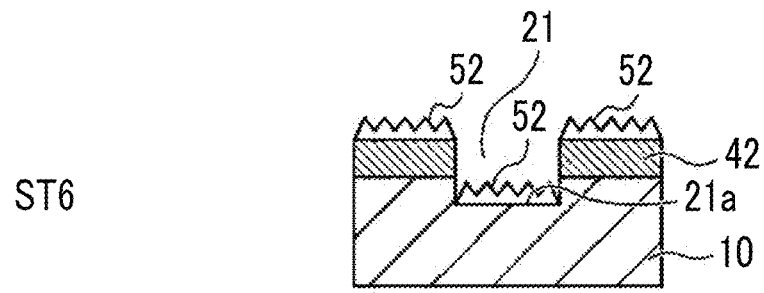
ST6

STRUCTURE MANUFACTURING METHOD

CROSS-REFERENCE TO RELATED APPLICATIONS

This application is a continuation application of International Application No. PCT/JP2021/005059, filed Feb. 10, 2021, the disclosure of which is incorporated herein by reference in its entirety. Further, this application claims priority from Japanese Patent Application No. 2020-055021, filed Mar. 25, 2020, the disclosure of which is incorporated herein by reference in its entirety.

BACKGROUND OF THE INVENTION

1. Field of the Invention

The present disclosure relates to a structure manufacturing method.

2. Description of the Related Art

In the related art, various methods of forming a nano-order fine recessed and projected structure on the surface of the substrate have been studied.

For example, JP5797133B discloses a method of forming a fine recessed and projected structure on a surface of a base material by providing a boehmite layer having fine recesses and projections on the surface of the substrate and etching the boehmite layer as a mask.

Further, JP2019-40039A discloses a method of forming a fine recessed and projected structure on the surface of the substrate by irregularly attaching chromium (Cr) particles to the surface of the substrate and etching the irregularly attached Cr particles as a mask.

On the other hand, there is known an imprint method in which a mold having a recessed and projected pattern on the surface is used and the recessed and projected pattern is transferred to the surface of the substrate to form a fine recessed and projected structure by a resin layer on the surface of the substrate. JP2019-153704A discloses, as a method of manufacturing an imprint mold having a stepped recessed portion, a method of manufacturing an imprint mold having a recessed and projected structure on the surface by repeating lithography and etching a plurality of times.

Further, JP2009-128538A discloses a method of forming micrometer-sized recesses and projections on the surface of the substrate and then forming micrometer-sized recesses and projections having a period smaller than that of the micrometer-sized recesses and projections on the surface of the recessed portions and projected portions.

SUMMARY OF THE INVENTION

By using the methods described in JP5797133B, JP2019-40039A, and JP2019-153704A, it is possible to form a fine recessed and projected structure smaller than a micrometer size on the surface of the substrate, respectively. Further, by using the method described in JP2009-128538A, it is possible to produce a structure in which two kinds of recessed and projected structures having different periods are formed.

The present inventors are studying to produce a structure having a fine recessed and projected structure only on a bottom surface of the recessed portion formed on the surface of the substrate. However, JP5797133B, JP2019-40039A, and JP2019-153704A do not disclose a method of manufacturing such a structure. Further, in a case where the method described in JP2009-128538A is used, a similar fine structure is formed not only on the bottom surface of the recessed portion but also on the surface other than the recessed portion of the substrate.

The present disclosure has been made in view of the above circumstances, and has an object to provide a manufacturing method of manufacturing a structure having a relatively small fine recessed and projected structure only on the bottom surface of a relatively large recessed portion formed on the surface of the substrate.

The structure manufacturing method of the present disclosure includes a mask formation step of forming a mask that has an opening pattern on a surface of a substrate;

a first etching step of etching the surface of the substrate with the mask to form a recessed portion corresponding to the opening pattern of the mask on the surface of the substrate;

a thin film formation step of forming a thin film including aluminum at least on a bottom surface of the recessed portion in a state where the mask remains;

a hot water treatment step of treating the thin film including aluminum with hot water to change the thin film into a fine recessed and projected layer including alumina hydrate smaller than the recessed portion;

a second etching step of etching the bottom surface of the recessed portion, on which the fine recessed and projected layer is formed, in a state where the mask remains to form a fine recessed and projected structure on the bottom surface of the recessed portion; and a mask removal step of removing the mask and the fine recessed and projected structure, which remains after the second etching step, after the second etching step.

In the structure manufacturing method of the present disclosure, in the thin film formation step, the thin film including aluminum may also be formed on the mask.

In the structure manufacturing method of the present disclosure, it is preferable that a difference in height between recesses and projections of the fine recessed and projected structure is smaller than a depth of the recessed portion.

In the structure manufacturing method of the present disclosure, it is preferable that the mask is made of an organic material.

In the structure manufacturing method of the present disclosure, the mask formation step may include a step of applying a photoresist, a step of exposing the photoresist, and a step of developing the photoresist.

In the structure manufacturing method of the present disclosure, the mask formation step may include a step of applying a resin layer and a step of transferring a recessed and projected pattern to the resin layer.

In the structure manufacturing method of the present disclosure, it is preferable that the substrate is a silicon substrate or a silicon compound substrate.

In the structure manufacturing method of the present disclosure, it is preferable that the etching in the second etching step is dry etching.

In the structure manufacturing method of the present disclosure, it is preferable that a gas used for the dry etching includes at least a fluorine-based gas or a chlorine-based gas.

In the structure manufacturing method of the present disclosure, it is preferable that the mask removal step includes a cleaning step using sulfuric acid hydrogen peroxide.

The present disclosure has been made in view of the above circumstances, and has an object to provide a manufacturing method of manufacturing a structure having a relatively small fine recessed and projected structure only on the bottom surface of a relatively large recessed portion formed on the surface of the substrate.

BRIEF DESCRIPTION OF THE DRAWINGS

FIG. 4 is a diagram showing steps of the manufacturing method of the embodiment (No. 2).

DESCRIPTION OF THE PREFERRED EMBODIMENTS

Hereinafter, embodiments of the present disclosure will be described with reference to the accompanying drawings. For easy visibility, the film thickness of each layer and their ratios are appropriately changed and drawn, and do not necessarily reflect the actual film thickness and proportion. In the present specification, the numerical range represented by using "to" means a range including the numerical values before and after "to" as the lower limit value and the upper limit value.

The structure manufacturing method of the present disclosure includes: a mask formation step of forming a mask that has an opening pattern on a surface of a substrate; a first etching step of etching the surface of the substrate with the mask to form a recessed portion corresponding to the opening pattern of the mask on the surface of the substrate; a thin film formation step of forming a thin film including aluminum at least on a bottom surface of the recessed portion in a state where the mask remains; a hot water treatment step of treating the thin film including aluminum with hot water to change the thin film into a fine recessed and projected layer including alumina hydrate smaller than the recessed portion; a second etching step of etching the bottom surface of the recessed portion, on which the fine recessed and projected layer is formed, in a state where the mask remains to form a fine recessed and projected structure on the bottom surface of the recessed portion; and a mask removal step of removing the mask and the fine recessed and projected structure, which remains after the second etching step, after the second etching step.

Figure 1:
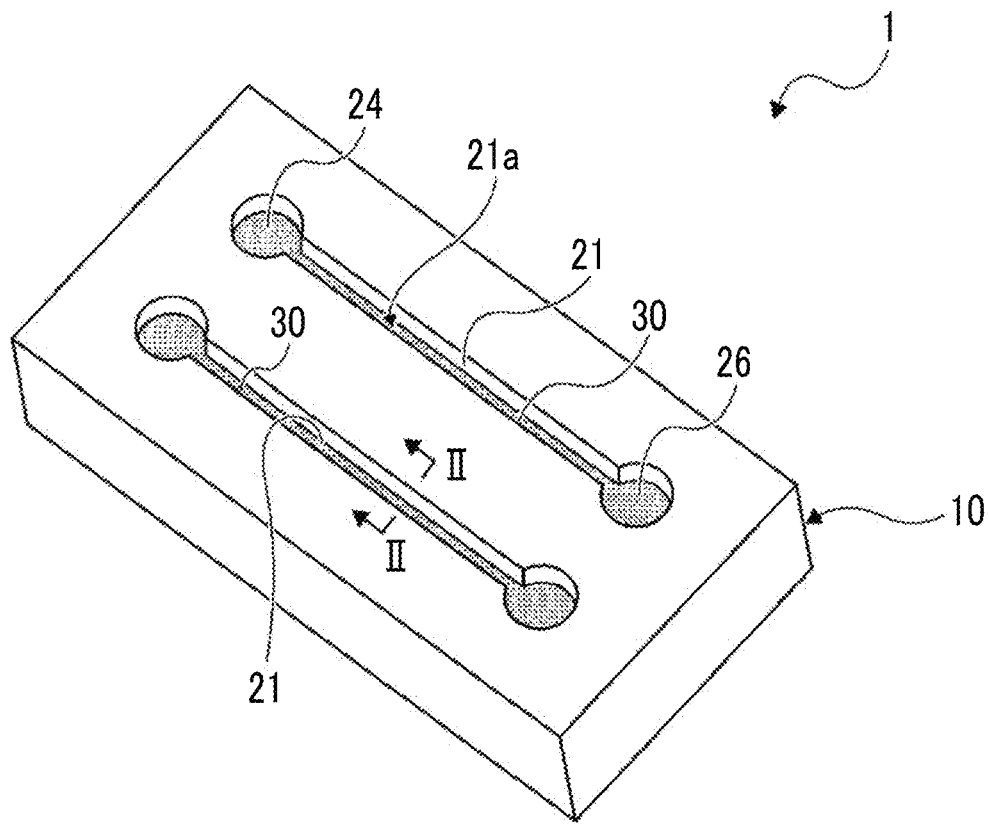
FIG. 1 is a perspective view of a structure manufactured by the manufacturing method of an embodiment.
Figure 2:
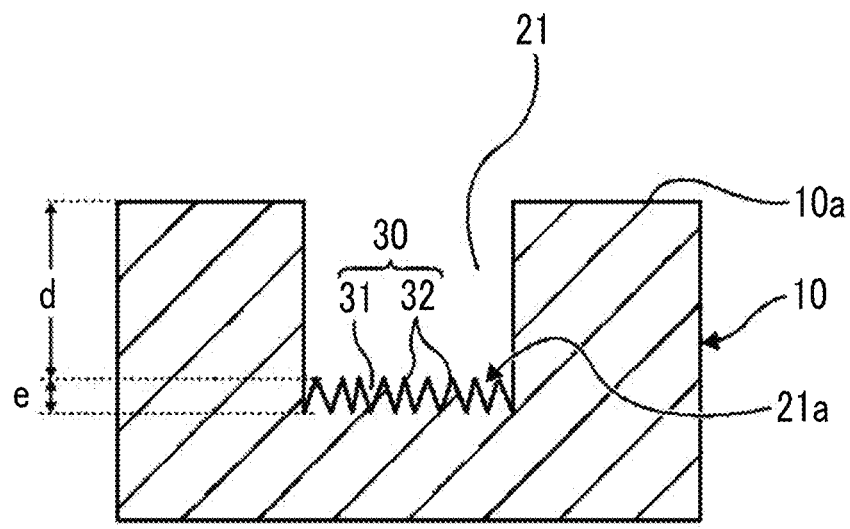
FIG. 2 is an end section view of the structure shown in FIG. 1 cut along the line II-II.

First, the structure manufactured by an embodiment of the structure manufacturing method of the present disclosure will be described. FIG. 1 is a perspective view of an example of the structure obtained by the embodiment of the manufacturing method of the present disclosure. FIG. 2 is a diagram showing a part of the II-II line cut end section of the structure 1 shown in FIG. 1. The structure 1 includes a substrate 10, a recessed portion 21 formed on one surface 10a of a substrate 10, and a fine recessed and projected structure 30 formed only on bottom surfaces 21a of the recessed portions 21 of the substrate 10. The structure 1 in the present example is used, for example, for measuring the reaction of a sample, and is a flow channel member provided with a flow channel through which a liquid including the sample flows. In the structure 1, the recessed portion 21 is used, for example, as a flow channel. Each recessed portion 21 is an elongated groove, and wide liquid reservoirs 24 and 26 are provided at both ends of the recessed portion 21 in the longitudinal direction. The liquid reservoirs 24 and 26 each function as an injection unit for injecting the liquid into the recessed portion 21 and a discharge unit for discharging the liquid from the recessed portion 21. As in the structure 1 of the present example, it is preferable that the difference e in height between recesses and projections of the fine recessed and projected structure 30 is less than the depth d of the recessed portion 21, in accordance with use of the structure such as a case where the structure 1 is used as a flow channel member in which the recessed portion 21 functions as a flow channel.

The fine recessed and projected structure 30 in the structure 1 includes a plurality of recessed portions 31 and a plurality of projected portions 32. The fine recessed and projected structure 30 is an irregular structure. Here, the term "irregular structure" means a structure, in which at least one of the size, shape and arrangement pitch of the projected portions 32 is not regular, such as a structure in which the size or shape of the projected portions 32 is not uniform or a structure in which the arrangement pitch as the distance between the plurality of adjacent projected portions 32 is not uniform. The average period of the fine recessed and projected structure 30 is 1 μm or less. Here, the average period of the fine recessed and projected structure 30 is an average of the distances between the plurality of projected portions 32. Each distance between the projected portions 32 is, in a case of focusing on one projected portion 32, a distance from a projected portion located closest to the projected portion 32 and is a distance between the tips of the two projected portions. Specifically, in a scanning electron microscope (SEM) image of the surface of the structure, the distances between the projected portions 32 at optional 10 locations are measured, and a value obtained by averaging the measured distances is the average period of the fine recessed and projected structure 30. The average period of the fine recessed and projected structure 30 is, for example, in a range of several nm to 1 μm, preferably in a range of 10 nm to 800 nm, more preferably in a range of 10 nm to 400 nm, and still more preferably in a range of 10 nm to 200 nm.

The size of the recessed portion 21 (the width of the flow channel in the present example) in the structure 1 is greater than the average period of the fine recessed and projected structure 30. That is, the structure 1 is provided with a relatively small fine recessed and projected structure 30 only on the bottom surfaces 21a of the relatively large recessed portions 21 formed on one surface 10a of the substrate 10. For example, the size of the recessed portion 21 can be set in a range of several μm to several tens of μm, and the average period of the fine recessed and projected structure 30 can be set in a range of several nm to several 100 nm. As described above, the size of the recessed portion 21 and the average period of the fine recessed and projected structure 30 may differ by one digit or more. It is apparent that the sizes may be different within the same number of digits. For example, the average period of the fine recessed and projected structure 30 is 100 nm in a case where the size of the recessed portion 21 is 500 nm, the average period of the fine recessed and projected structure 30 is 1 µm in a case where the size of the recessed portion 21 is 5 µm, or the like.

Figure 3:
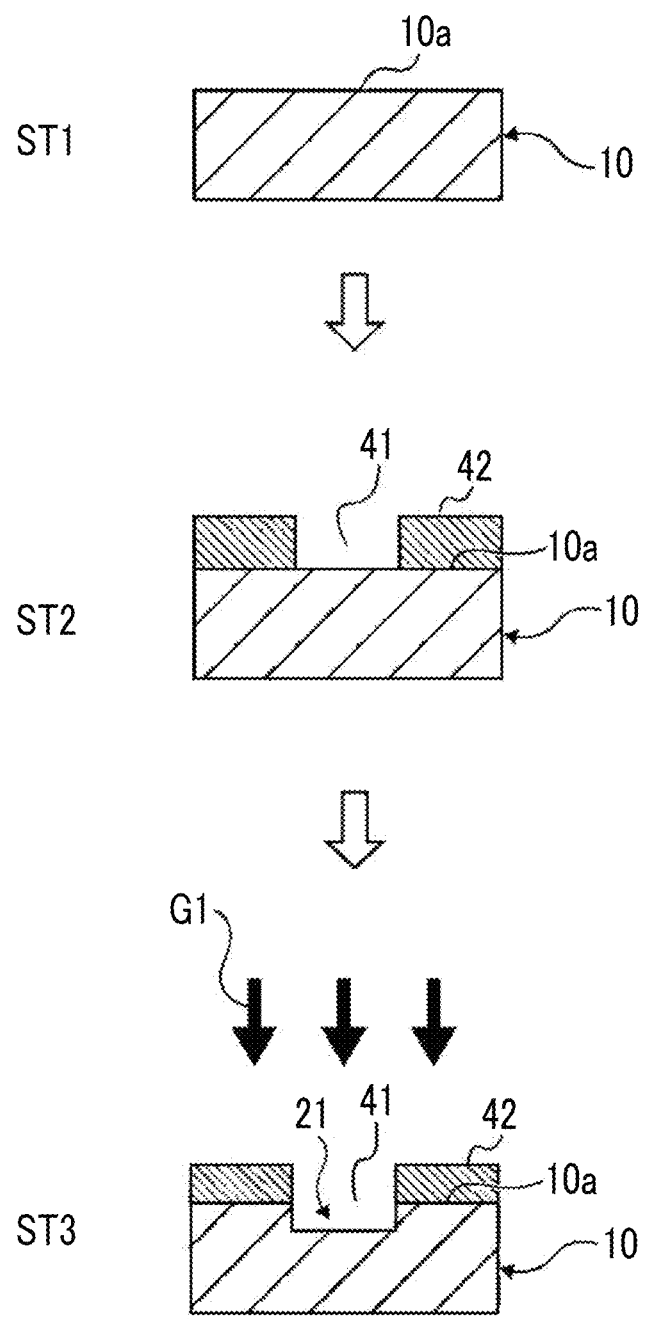
FIG. 3 is a diagram showing steps of the manufacturing method of the embodiment (No. 1).
Figure 5:
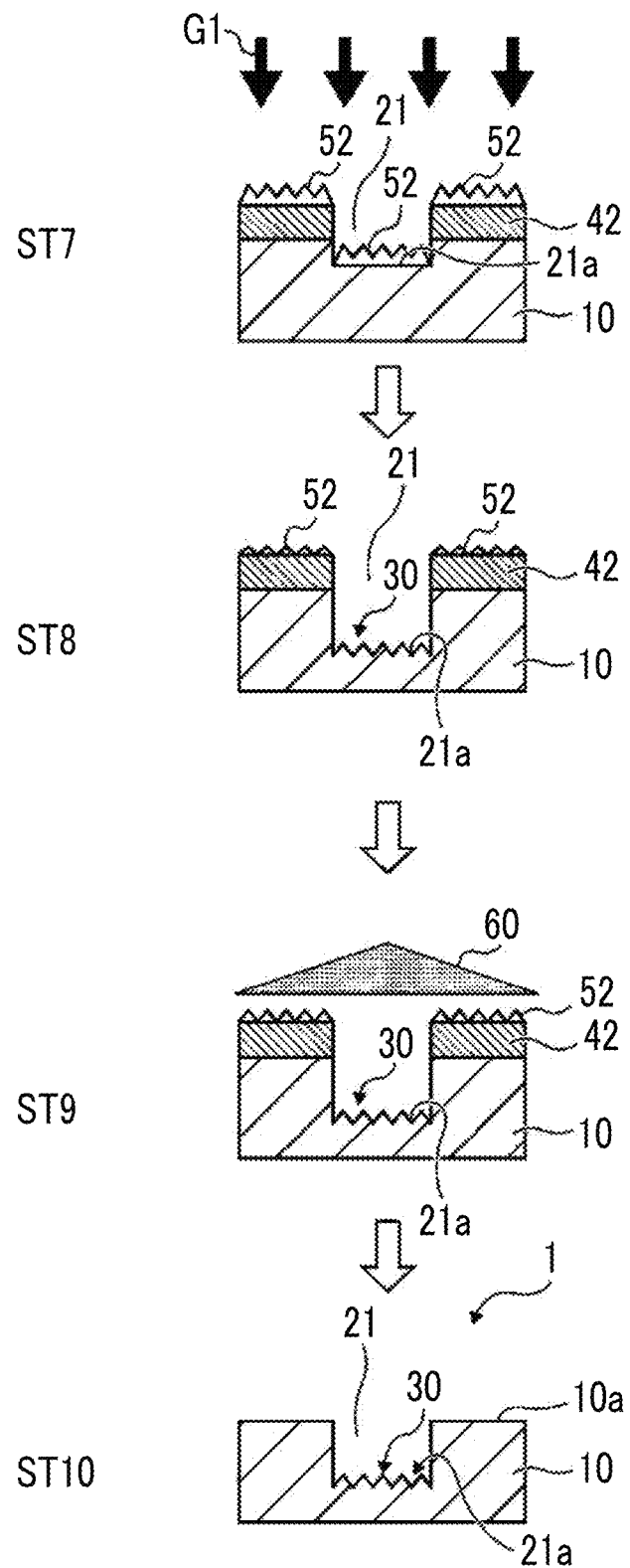
FIG. 5 is a diagram showing steps of the manufacturing method of the embodiment (No. 3).

Next, an embodiment of the structure manufacturing method of the present disclosure for manufacturing the above structure will be described with reference to FIGS. 3 to 5. FIGS. 3 to 5 are diagrams schematically showing manufacturing steps. In the structure manufacturing method of the present embodiment, the mask formation step, the first etching step, the thin film formation step, the hot water treatment step, the second etching step, and the mask removal step are performed in order.

First, as shown in ST1 of FIG. 3, the substrate 10 is provided.

Next, as shown in ST2 of FIG. 3, in the mask formation step, a mask 42 having an opening pattern including a predetermined opening 41 is formed on one surface 10a of the substrate 10.

Next, as shown in ST3 of FIG. 3, in the first etching step, etching is performed on one surface 10a of the substrate 10 using the mask 42 formed in the mask formation step. By the etching, recessed portions 21 corresponding to the opening pattern of the mask 42 are formed on one surface 10a of the substrate 10. Even after the first etching step, the mask 42 remains in the region other than the part where the recessed portions 21 on one surface 10a of the substrate 10 are formed.

Next, as shown in ST4 of FIG. 4, in the thin film formation step, a thin film 50 including aluminum (hereinafter referred to as an Al-containing thin film 50) is formed on the bottom surfaces 21a of the recessed portions 21 in a state where the mask 42 remains. The Al-containing thin film 50 is formed not only on the bottom surfaces 21a but also on the entire surface of the substrate 10 including the mask 42. Further, the thin film formation step is performed by, for example, sputtering.

Then, as shown in ST5 of FIG. 4, the Al-containing thin film 50 is treated with hot water in the hot water treatment step. For example, as shown in ST5 of FIG. 4, the pure water 56 in the container 55 is heated to hot water by using the hot plate 58. The entire substrate 10 on which the Al-containing thin film 50 is formed is immersed in the hot water. By hot water treatment, as shown in ST6 of FIG. 4, the Al-containing thin film 50 is changed into a fine recessed and projected layer 52 including alumina hydrate. The fine recessed and projected layer 52 has a plurality of projected portions and a plurality of recessed portions having an irregular structure. The size of the projected portions of the fine recessed and projected layer 52 and the average distance between the projected portions (that is, the average period of the recesses and projections) can be controlled by the material of the Al-containing thin film 50, the formation thickness, and the hot water treatment conditions. However, the average period thereof is approximately 1 µm or less.

Further, as shown in ST7 of FIG. 5, in the second etching step, by etching from the surface of the fine recessed and projected layer 52 on the bottom surface 21a of the recessed portion 21 on which the fine recessed and projected layer 52 including the alumina hydrate in a state where the mask 42 remains, the fine recessed and projected structure 30 is formed on the bottom surface 21a of the recessed portion 21 as shown in ST8. In a case where etching is performed from the surface of the fine recessed and projected layer 52, the recessed and projected shape of the surface of the fine recessed and projected layer 52 gradually recedes due to dissolution erosion due to etching, and dissolution erosion acts such that the recesses and projections of the fine recessed and projected layer 52 are reflected on the surface of the substrate 10. Thereby, the fine recessed and projected structure 30, in which the form of the fine recessed and projected layer 52 is reflected on the bottom surface 21a, is formed. It should be noted that the meaning that the recessed and projected shape of the fine recessed and projected layer 52 is "reflected" means a state in which projected portions or recessed portions are provided at positions one-to-one corresponding to the projected portions or recessed portions of the recessed and projected shape, that is, a state in which there is some similarity to the undulations regardless of the position accuracy of transfer.

Further, in the present example, on one surface 10a of the substrate 10, the fine recessed and projected layer 52 is formed not only on the recessed portions 21 but also on the mask 42 remaining in the part other than the recessed portion 21. Then, in the second etching step, etching is performed on the entire surface of the substrate 10 that includes the mask 42 and the recessed portion 21. However, since a part of one surface 10a of the substrate 10 covered with the mask 42 is protected by the mask 42, the dissolution erosion action by etching does not reach the part protected by the mask 42. As a result, the fine recessed and projected structure 30 is formed only on the bottom surface 21a of the recessed portion 21 corresponding to the opening 41 of the mask 42 on one surface 10a of the substrate 10.

Then, after the second etching step shown in ST7 and ST8, as shown in ST9 of FIG. 5, by spraying the stripper 60 onto the substrate 10 in the mask removal step, the mask 42 and the fine recessed and projected structure 30, which remains after the second etching step, are removed.

Through the above-mentioned steps, the structure 1 shown in ST10 of FIG. 5 can be obtained.

According to the structure manufacturing method of the present disclosure, the structure 1 having the fine recessed and projected structure 30 can be manufactured only on the bottom surface 21a of the recessed portion 21 formed on one surface 10a of the substrate 10.

In the structure manufacturing method of the present embodiment, after the recessed portion 21 is formed by the first etching step, the thin film formation step, the hot water treatment step, and the second etching step are performed in a state where the mask 42 remains on one surface 10a of the substrate 10 without removal of the mask 42. Therefore, on one surface 10a of the substrate 10, the dissolution erosion action of etching is not applied to the protected part protected by the mask 42, and the dissolution erosion action is applied only to the bottom surface 21a of the recessed portion 21 corresponding to the opening 41 of the mask 42. Therefore, the fine recessed and projected structure 30 can be formed only on the bottom surface 21a of the recessed portion 21 on one surface 10a of the substrate 10. The fine recessed and projected structure 30 has a form that reflects the recesses and projections of the fine recessed and projected layer 52 having an average period of 1 µm or less. Therefore, the average period is 1 µm or less like the fine recessed and projected layer 52.

As described above, according to the manufacturing method of the present disclosure, it is possible to obtain a structure (structure 1 as an example) provided with a relatively small fine recessed and projected structure (a fine recessed and projected structure 30 as an example) is formed only on the bottom surface of the relatively large recessed portion (recessed portion 21 as an example) formed on one surface of a substrate (the substrate 10 as an example).

Further, as a method of forming the fine recessed and projected layer 52 including the alumina hydrate necessary for forming the fine recessed and projected structure 30, a formation method, in which an Al-containing thin film 50 is formed and treated with hot water, is employed. Therefore, the fine recessed and projected layer 52 can be formed by a very simple method.

The use of the structure 1 shown in FIG. 1 is a flow channel member in the present example. Such a flow channel member can be used as a microfluidic device used for an immunoassay or a biochemical test by attaching a lid member provided with a liquid injection port at a position corresponding to each of the liquid reservoirs 24 and 26 to one surface 10a of the substrate 10. Since the structure 1 is provided with the fine recessed and projected structure 30 on the bottom surface of the recessed portion 21 which is the flow channel, it is possible to obtain the effect of enhancing the adhesiveness in a case where an antibody, an enzyme, or the like is attached. Further, since one surface 10a of the substrate of the structure 1 does not have a fine recessed and projected structure, favorable adhesion can be obtained in a case where the lid member is attached.

Further, although the structure 1 shown in FIG. 1 is provided with the fine recessed and projected structure 30 over the entire region of the bottom surface 21a of the recessed portion 21, even in a case where the fine recessed and projected structure 30 may be formed only in a part of the flow channel. In such a case, for example, in a case where a sample including cells is flowed through a flow channel, the cells can be captured by the fine recessed and projected structure 30.

Hereinafter, details of the steps will be described.

The material of the substrate 10 is not particularly limited, but for example, a silicon or a silicon compound can be used. The silicon or the silicon compound is preferable because it is easy to control the etching selectivity. Examples of the silicon compound include silicon oxide and silicon nitride. Specifically, a silicon wafer, quartz glass, or the like can be used in the substrate 10.

The method of forming the mask and the mask material in the mask formation step are not particularly limited, but it is preferable that the mask 42 is made of an organic material. In a case where an organic material is used, a mask 42 having a desired opening pattern can be easily formed. Hereinafter, a method of forming the mask 42 from the organic material will be briefly described.

Figure 6:
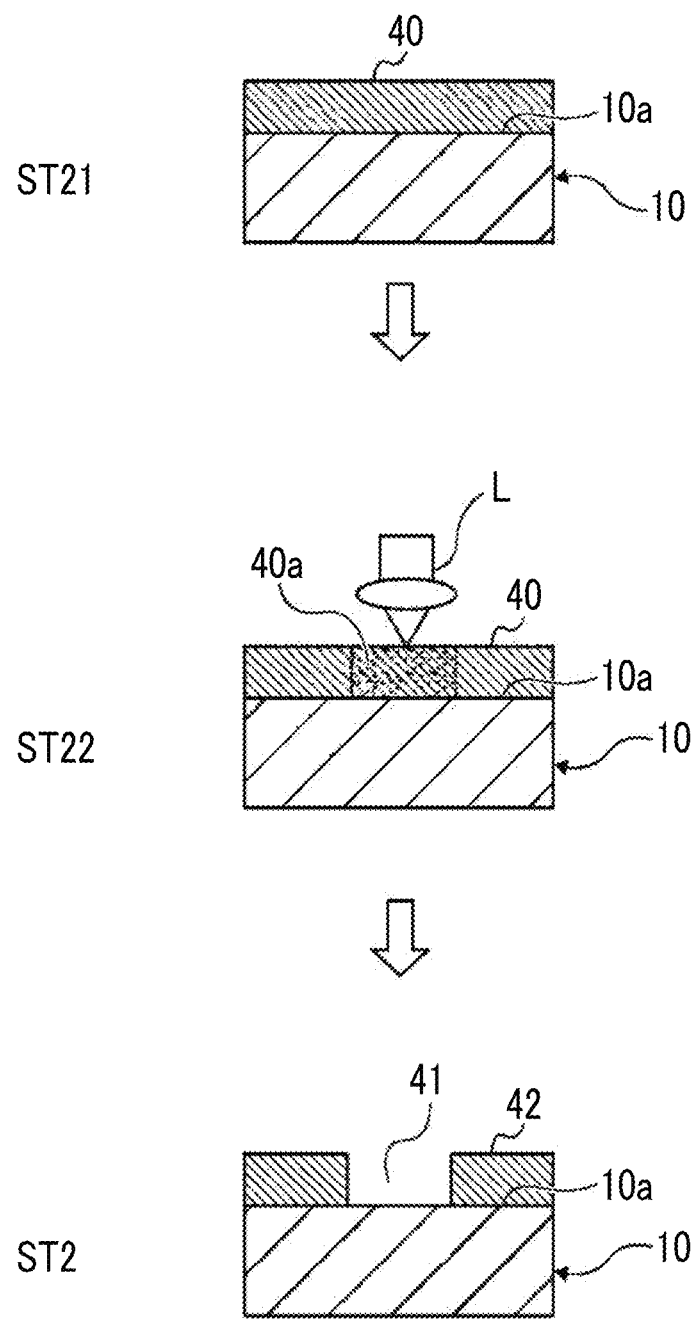
FIG. 6 is a diagram showing an example of a mask formation step.

An exemplary mask formation step includes a step of applying a photoresist, a step of exposing the photoresist, and a step of developing the photoresist. As shown in ST21 of FIG. 6, a positive photoresist 40 is applied to one surface 10a of the substrate 10. As shown in ST22 of FIG. 6, exposure is performed thereon by irradiating a part 40a forming an opening of the photoresist 40 with laser light L. Thereafter, by developing the photoresist 40, only the exposed part 40a of the photoresist 40 can be dissolved to form the opening 41, and the mask 42 having the opening pattern can be formed.

Figure 7:
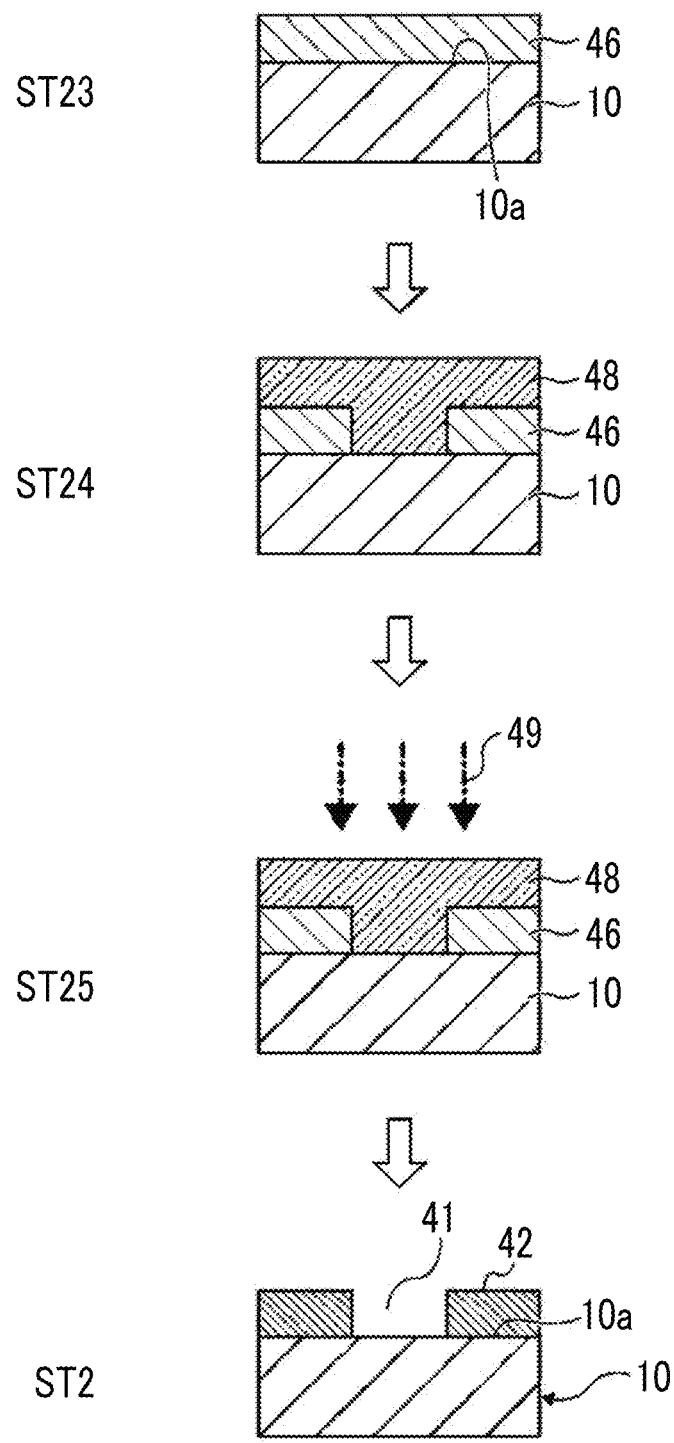
FIG. 7 is a diagram showing another example of the mask formation step.

Alternatively, the mask formation step of another example may include a step of applying the resin layer and a step of transferring the recessed and projected pattern to the resin layer. As shown in ST23 of FIG. 7, a resin layer 46 made of, for example, a photocurable resin composition is applied to one surface 10a of the substrate 10. Then, as shown in ST24 of FIG. 7, by using an imprinting mold 48 having a recessed and projected pattern corresponding to the opening pattern of the mask to be formed, the recessed and projected pattern surface is pressed against the resin layer 46, and the recessed and projected pattern is transferred to the resin layer 46. Then, as shown in ST25 of FIG. 7, the resin layer 46 is cured by irradiating the resin layer 46 with ultraviolet light 49, and then the imprinting mold 48 is peeled off. Thereby, it is possible to obtain the mask 42 having the opening pattern on the substrate 10.

In the first etching step, even after the first etching step, etching is performed such that the mask 42 remains in the region other than the part where the recessed portions 21 on one surface 10a of the substrate 10 is formed.

Therefore, in the first etching step, it is preferable to perform etching under a condition that the etching rate for the substrate 10 is greater than the etching rate for the mask 42.

In the first etching step, for example, it is preferable to use dry etching using an etching gas G1. By using dry etching, a desired shape can be produced with a high accuracy. More specifically, the reactive ion etching is preferable. In order to make the etching rate for the substrate 10 greater than the etching rate for the mask 42, it is preferable to use the etching gas G1 having favorable etching efficiency for the substrate 10. Specifically, for example, in a case where silicon is used for the substrate, the etching gas may be a fluorine-based gas or a chlorine-based gas. As the fluorine-based gas, for example, trifluoromethane ($CFH_3$) or sulfur hexafluoride ($SF_6$) can be employed, and as the chlorine-based gas, for example, chlorine ($Cl_2$) can be employed.

Here, the etching in the first etching step is not limited to dry etching and may be wet etching.

In the thin film formation step, the Al-containing thin film 50 may be formed at least on the bottom surface 21a of the recessed portion 21. However, the Al-containing thin film 50 may also be formed not only on the bottom surface 21a of the recessed portions 21 but also on the mask 42 remaining on one surface 10a of the substrate 10 as shown in ST6 of FIG. 4. The thin film formation step is performed in a state where the mask 42 remains. Therefore, as a treatment, it is easier to form the Al-containing thin film 50 in the entire region including the mask 42, through the above-mentioned example, than to form the Al-containing thin film 50 only on the bottom surface 21a except for the region of the mask 42.

The Al-containing thin film 50 is, for example, a thin film made of any one of aluminum, aluminum oxide, aluminum nitride, or an aluminum alloy, but may be made of a material changed into a fine recessed and projected layer including an alumina hydrate such as boehmite by hot water treatment in a subsequent step. The "aluminum alloy" includes at least one element such as silicon (Si), iron (Fe), copper (Cu), manganese (Mn), magnesium (Mg), zinc (Zn), chromium (Cr), titanium (Ti), and nickel (Ni), and means a compound or a solid solution including aluminum as a main component. From the viewpoint of forming the recessed and projected structure, it is preferable that the Al-containing thin film 50 has an aluminum component ratio of 80 mol % or more with respect to all metal elements.

The thickness of the Al-containing thin film 50 may be set in accordance with the desired thickness of the fine recessed and projected layer obtained in the subsequent step. For example, the thickness of the Al-containing thin film 50 is in a range of 0.5 to 60 nm, preferably in a range of 2 to 40 nm, and particularly preferably in a range of 5 to 20 nm.

The method of forming the Al-containing thin film 50 is not particularly limited. For example, general film formation methods such as a resistance heating vapor deposition method, an electron beam vapor deposition method, and a sputtering method can be used. Further, as a method of forming the Al-containing thin film 50 in the recessed portion 21, an electrodeposition bath may be used.

The "hot water treatment" in the hot water treatment step means a treatment in which hot water acts on a thin film that contains aluminum. Examples of the hot water treatment include a method of immersing the laminate in which the thin film 50 including aluminum is formed in water at room temperature and then boiling the water, a method of immersing the laminate in hot water maintained at a high temperature, or a method of exposing the laminate to high temperature steam. As described above, in the present embodiment, the pure water 56 in the container 55 is heated by using the hot plate 58 to make hot water, and the substrate 10 is immersed in the hot water. The time for immersing in hot water and the temperature of hot water are appropriately set in accordance with the desired recessed and projected structure. The time as a standard is 1 minute or more, particularly 3 minutes or more, and suitably 15 minutes or less. The temperature of the hot water is preferably 60° C. or higher, and particularly preferably higher than 90° C. The higher the temperature, the shorter the treatment time tends to be. For example, in a case where a thin film including aluminum having a thickness of 10 nm is boiled in hot water at 100° C. for 3 minutes, it is possible to obtain a recessed and projected structure in which the projected portions are randomly disposed at distances between the projected portions in a range of 50 to 300 nm and heights of the projected portions in a range of 50 to 100 nm. The size of the projected portions and the distance between the projected portions can be controlled by the material of the Al-containing thin film 50, the formation thickness and the hot water treatment conditions.

In the second etching step, it is preferable to use, for example, the reactive ion etching, the reactive ion beam etching, or the like. In the second etching step, it is preferable to perform etching under the condition that the etching rate of the substrate 10 is higher than the etching rate of the fine recessed and projected layer 52.

Figure 8:
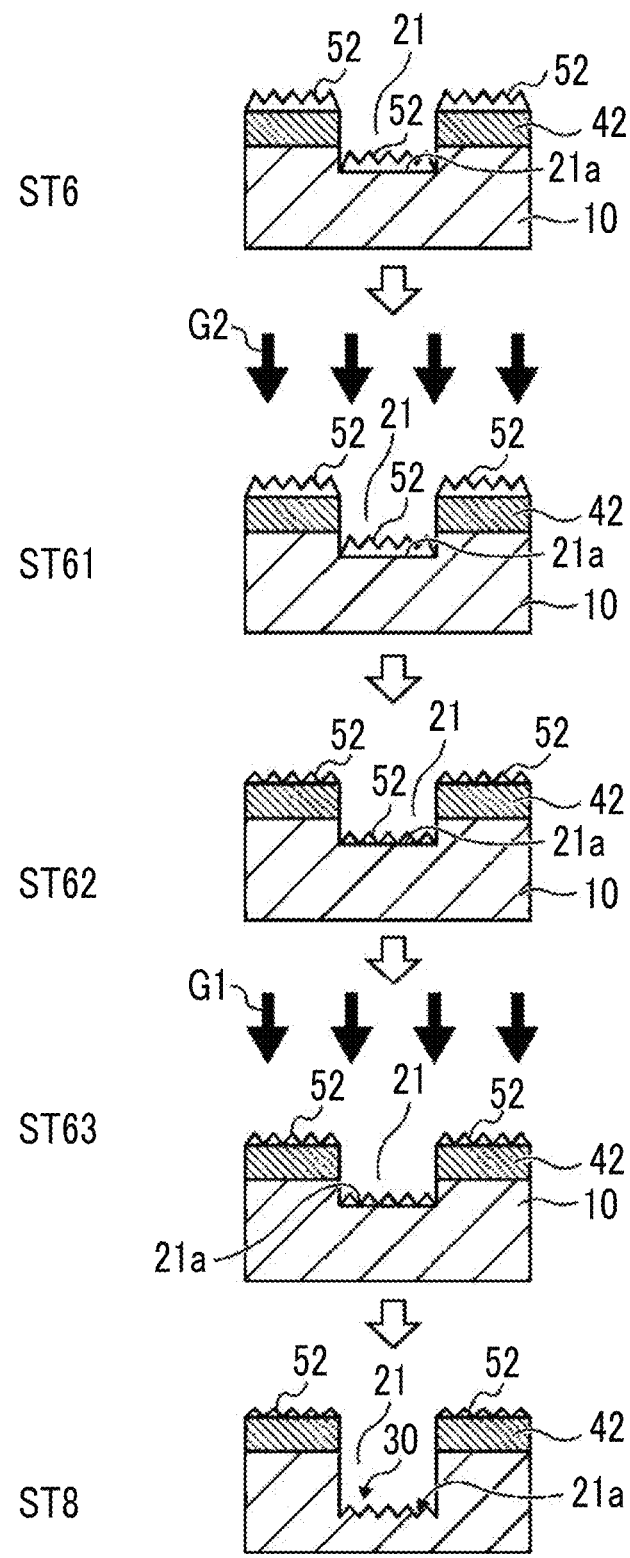
FIG. 8 is a diagram showing steps of breakthrough treatment for a fine recessed and projected layer including alumina hydrate.

It is also preferable to have a pretreatment step of etching the fine recessed and projected layer 52 until at least a part of the bottom surface 21a of the recessed portion 21 is exposed before the second etching step. Specifically, as shown in FIG. 8, it is preferable to perform a breakthrough treatment of the fine recessed and projected layer 52 as a pretreatment step after the formation of the fine recessed and projected layer 52 (ST6). Specifically, as shown in ST61 of FIG. 8, the fine recessed and projected layer 52 is etched to expose the bottom surface 21a of the recessed portion 21 in at least a part of the recessed portion of the fine recessed and projected layer 52 as shown in ST62. In the breakthrough treatment, in order to efficiently etch the fine recessed and projected layer 52, an etching gas G2 having a high efficiency of etching for alumina hydrate is used. As the etching gas G2, for example, a gas including argon (Ar) and trifluoromethane ($CHF_3$) is used. Thereafter, as a second etching step, as shown in ST63 of FIG. 8, the fine recessed and projected structure 30 is formed on the bottom surface 21a of the recessed portion 21 by performing etching from the fine recessed and projected layer 52 side using the etching gas G1 (ST8). By performing the breakthrough treatment, the time required for the second etching step can be significantly shortened. Therefore, the manufacturing efficiency of the entire manufacturing step can be improved.

The mask removal step preferably includes a cleaning step using sulfuric acid hydrogen peroxide which is a mixture of sulfuric acid $H_2SO_4$ and hydrogen peroxide $H_2O_2$, for example, SH-303 manufactured by Kanto Chemical Co., Ltd. By using sulfuric acid hydrogen peroxide, both the alumina hydrate and the mask 42 remaining after the second etching step can be efficiently removed.

The structure produced by the manufacturing method of the present disclosure is not limited to the flow channel member. For example, it is also possible to produce a structure such as a microwell having one or a plurality of recessed portions having circular, rectangular or polygonal openings on the substrate and each having a fine recessed and projected structure only on the bottom surface of the recessed portions. The size of the recessed portion having a circular, rectangular or polygonal opening is defined by the circle-equivalent diameter of the recessed portion opening. Here, the circle-equivalent diameter means a diameter of a circle having the same area as an area of the opening.

EXAMPLES

The flow channel member was manufactured using the structure manufacturing method described above. The specific manufacturing method is as follows.

A silicon wafer was used as the substrate. In the mask formation step, AZP4620 was used as a photoresist, exposure was performed using laser light having a wavelength of 405 nm, and development treatment was performed to form the mask. In the first etching step, the reactive ion etching was performed using a mask and a mixed gas of $SF_6$ gas and $CHF_3$ gas as the etching gas to form the flow channel and the recessed portion as a liquid pool on one surface of the substrate.

In the thin film formation step, a thin aluminum film was formed as the Al-containing thin film by the sputtering method. The thickness of the thin aluminum film was 10 nm. Then, as the hot water treatment, the substrate was immersed in boiling pure water for 3 minutes to change the thin aluminum film into a fine recessed and projected layer including alumina hydrate.

In the second etching step, the breakthrough treatment was then performed from the surface of the fine recessed and projected layer using a mixed gas of Ar gas and $CHF_3$ gas, and the reactive ion etching was performed using a mixed gas of $SF_6$ gas and $CHF_3$ gas. Thereby, the fine recessed and projected structure was formed on the bottom surface of the recessed portion formed in the first etching step.

Finally, the mask and the fine recessed and projected structure remaining after the second etching step were removed by cleaning with sulfuric acid hydrogen peroxide, and the flow channel member was produced as an example of the structure.

Figure 9:
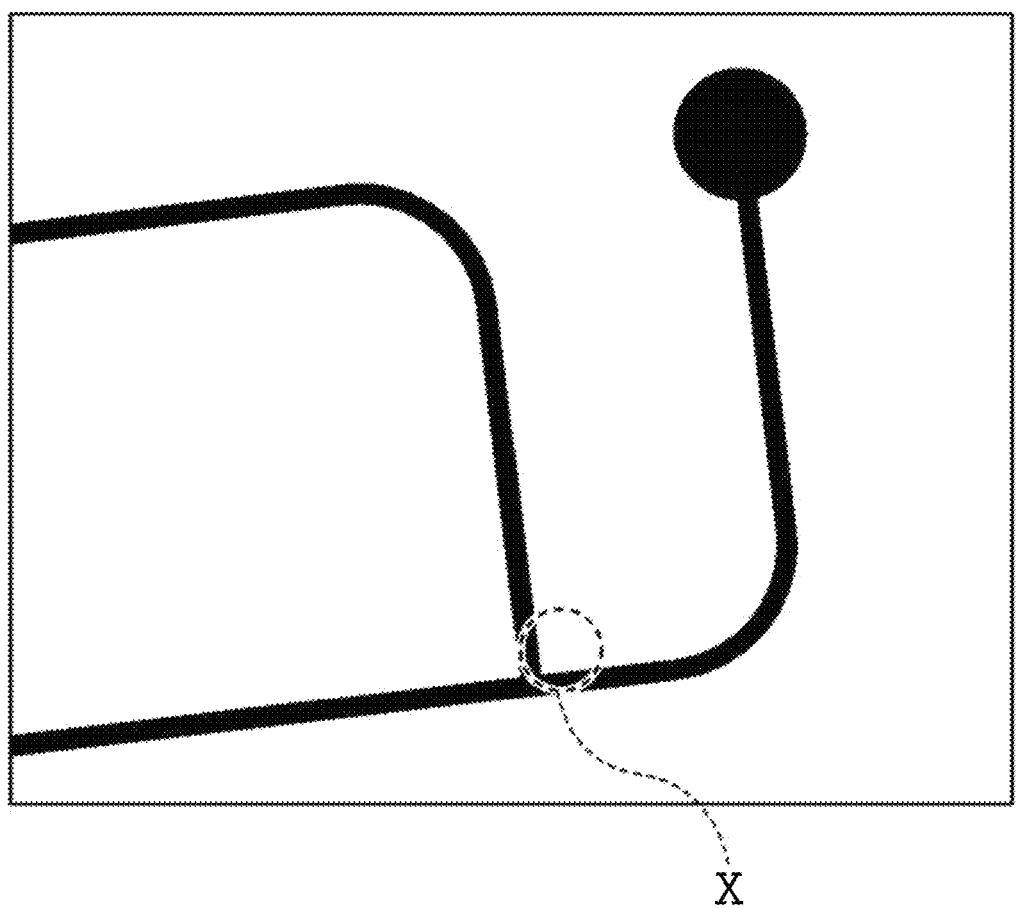
FIG. 9 is a picture showing a part of the structure of the example.

FIG. 9 is an external view showing a part of the flow channel member produced as described above. The flow channel member has a flow channel observed linearly and a liquid pool observed circularly in FIG. 9. The flow channel and the liquid pool are recessed portions formed in the first etching step. Here, the flow channel width of the flow channel member, that is, the width of the recessed portion is set to 40 μm.

Figure 10:
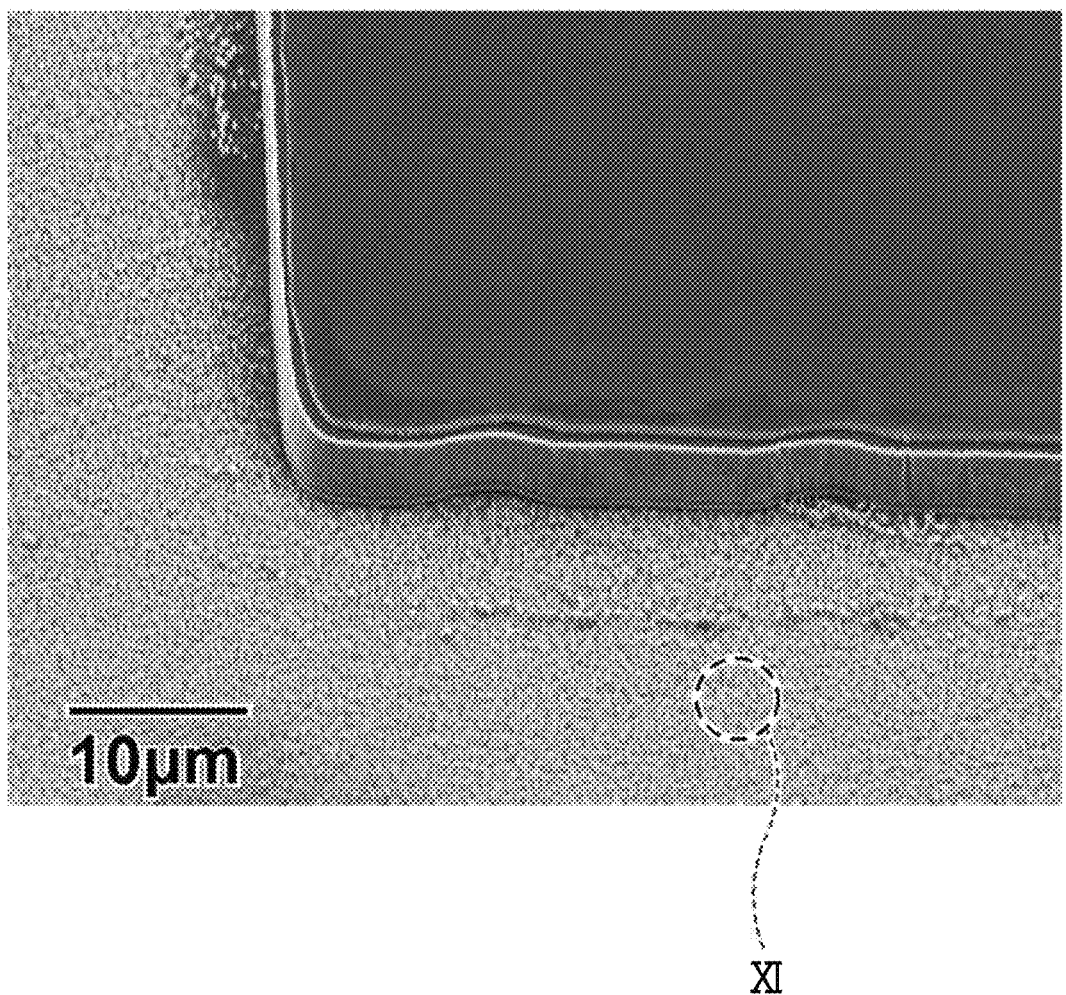
FIG. 10 is an enlarged scanning micrograph of the part of the structure shown in FIG. 9.
Figure 11:
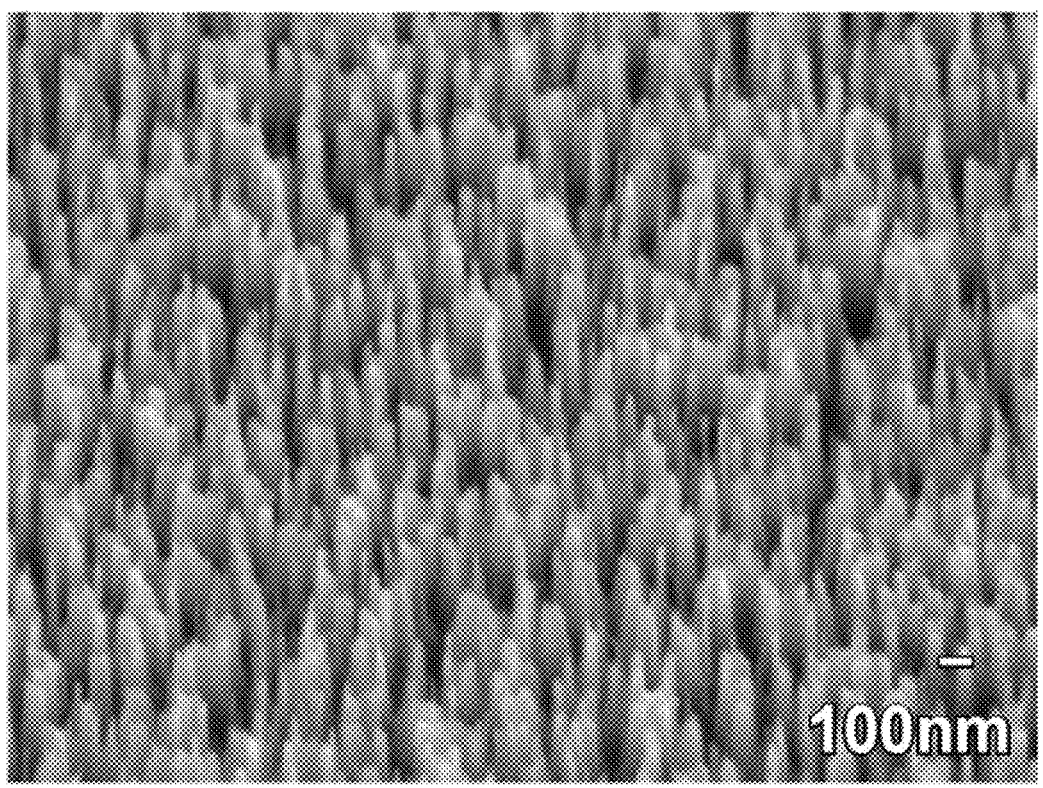
FIG. 11 is a further enlarged scanning micrograph of the part of the structure shown in FIG. 10.

FIG. 10 is an SEM image of a part in which the two flow channels of FIG. 9 intersect. In FIG. 10, the bottom surface of the recessed portion and one surface of the substrate that is convex with respect to the recessed portion are shown. In FIG. 10, one surface of the substrate is observed to be black and smooth, and the bottom surface of the recessed portion is observed to be white and rough. FIG. 11 is an enlarged SEM image of a part of the bottom surface of the recessed portion of FIG. 10. From FIG. 11, it can be seen that a large number of extremely fine recesses and projections are formed on the bottom surface of the recessed portion.

As described above, according to the above-mentioned structure manufacturing method, it was possible to produce the structure having the fine recessed and projected structure only on the bottom surface of a relatively large recessed portion.

The present disclosure of Japanese patent application 2020-055021 filed on 25 Mar. 2020 is incorporated herein by reference in its entirety.

All documents, patent applications, and technical standards described in the present specification are incorporated into the present specification by reference to the same extent as in a case where the individual documents, patent applications, and technical standards were specifically and individually stated to be incorporated by reference.

What is claimed is:

1. A structure manufacturing method comprising:
   a mask formation step of forming a mask that has an opening pattern on a surface of a substrate;
   a first etching step of etching the surface of the substrate with the mask to form a recessed portion corresponding to the opening pattern of the mask on the surface of the substrate;
   a thin film formation step of forming a thin film including aluminum at least on a bottom surface of the recessed portion in a state where the mask remains;
   a hot water treatment step of treating the thin film including aluminum with hot water to change the thin film into a fine recessed and projected layer including alumina hydrate smaller than the recessed portion;
   a second etching step of etching the bottom surface of the recessed portion, on which the fine recessed and projected layer is formed, in a state where the mask remains to form a fine recessed and projected structure on the bottom surface of the recessed portion; and
   a mask removal step of removing the mask and the fine recessed and projected structure, which remains after the second etching step.

2. The structure manufacturing method according to claim 1, wherein in the thin film formation step, the thin film including aluminum is also formed on the mask.

3. The structure manufacturing method according to claim 1, wherein a difference in height between recesses and projections of the fine recessed and projected structure is smaller than a depth of the recessed portion.

4. The structure manufacturing method according to claim 1, wherein the mask is made of an organic material.

5. The structure manufacturing method according to claim 1, wherein the mask formation step includes a step of applying a photoresist, a step of exposing the photoresist, and a step of developing the photoresist.

6. The structure manufacturing method according to claim 1, wherein the mask formation step includes a step of applying a resin layer and a step of transferring a recessed and projected pattern to the resin layer.

7. The structure manufacturing method according to claim 1, wherein the substrate is a silicon substrate or a silicon compound substrate.

8. The structure manufacturing method according to claim 1, wherein the etching in the second etching step is dry etching.

9. The structure manufacturing method according to claim 8, wherein a gas used for the dry etching includes at least a fluorine-based gas or a chlorine-based gas.

10. The structure manufacturing method according to claim 1, wherein the mask removal step includes a cleaning step using sulfuric acid hydrogen peroxide.

* * * * *